United States Patent [19]

Iwata

[11] Patent Number: 5,933,381
[45] Date of Patent: Aug. 3, 1999

[54] SEMICONDUCTOR INTEGRATED CIRCUIT HAVING DRAM MOUNTED ON SEMICONDUCTOR CHIP

[75] Inventor: Shunichi Iwata, Tokyo, Japan

[73] Assignee: Mitsubishi Denki Kabushiki Kaisha, Tokyo, Japan

[21] Appl. No.: 09/030,425

[22] Filed: Feb. 25, 1998

[30] Foreign Application Priority Data

Sep. 25, 1997 [JP] Japan ................................. 9-259824

[51] Int. Cl.[6] ............................................... G11C 11/406
[52] U.S. Cl. ................................. 365/222; 365/238.5
[58] Field of Search ........................... 365/222, 189.08, 365/235, 238.5; 711/106

[56] References Cited

U.S. PATENT DOCUMENTS

| | | | |
|---|---|---|---|
| 4,172,282 | 10/1979 | Aichelmann, Jr. et al. | 365/222 |
| 4,701,843 | 10/1987 | Cohen | 365/222 |
| 5,345,574 | 9/1994 | Sakurada et al. | 365/222 |
| 5,379,400 | 1/1995 | Barakat et al. | 365/222 |
| 5,717,644 | 2/1998 | Hadderman et al. | 365/222 |

FOREIGN PATENT DOCUMENTS

| | | |
|---|---|---|
| 63-229694 | 9/1988 | Japan . |
| 7-262773 | 10/1995 | Japan . |

*Primary Examiner*—Tan T. Nguyen
*Attorney, Agent, or Firm*—Burns, Doane, Swecker & Mathis, LLP

[57] ABSTRACT

In a semiconductor integrated circuit, a CPU (2), a DRAM (3), and a bus controller (5) are mounted on a same semiconductor chip. The bus controller (5) has a refresh control circuit (7, 70) including a refresh request circuit to output a refresh request at a constant timing, a forced refresh request circuit to output the refresh request at an optional timing that is different from the constant timing, and a refresh request stop circuit to output the refresh request forcibly.

8 Claims, 6 Drawing Sheets

SEMICONDUCTOR INTEGRATED CIRCUIT HAVING DRAM MOUNTED ON SEMICONDUCTOR CHIP

BACKGROUND OF THE INVENTION

1. Field of the Invention

The present invention relates to a semiconductor integrated circuit in which a dynamic random access memory (DRAM), a central processing unit (CPU), and the like are mounted on a same semiconductor chip.

2. Description of the Prior Art

FIG. 4 is a diagram showing a configuration of a conventional semiconductor integrated circuit having a DRAM, a central processing unit (CPU), a bus controller, and the like mounted on a same semiconductor chip 101. In FIG. 4, the reference number 101 designates a semiconductor chip, 102 denotes a CPU mounted on the semiconductor chip 101, 103 indicates a dynamic random access memory (DRAM) mounted on the semiconductor chip 101, and 104 designates a bus controller mounted on the semiconductor chip 101. The bus controller 104 incorporates a control circuit to perform an access control and a refresh control to the DRAM 101. The reference number 105 designates an internal bus group through which the CPU 101, the DRAM 103, and the bus controller 104 are connected to each other.

Next, a description will now be given of the operation of the conventional semiconductor integrated circuit having the DRAM 103 and other devices.

For example, the CPU 102 performs an access control operation and a refresh control operation as control operations to the DRAM 103.

First, the access control operation and the refresh control operation in the conventional semiconductor integrated circuit having the DRAM 103 and other devices mounted on the same semiconductor chip 101 will be explained.

Access control

The DRAM 103 is accessed in accordance with a DRAM access request transferred from the CPU 102 to the DRAM 103. During the DRAM access operation, when the DRAM 103 has the function of a page mode, it is checked whether a page hit occurs or not. When the page hit occurs, the DRAM 103 is accessed in the page mode.

The operation of the page mode in the DRAM 103 will be explained in detail by using a simple configuration model of the DRAM 103 shown in FIG. 5. In FIG. 5, the reference numbers 0 to 15 designate memory cells.

When the DRAM 103 is accessed, first, a row address is inputted, after this, a column address is inputted to the DRAM 103. For example, when a data item stored in the memory cell 9 is read, a target address becomes a binary number "1001". When the DRAM 103 is accessed, firstly, the row address "10" of a binary number is given to the row address decoder 501. Thereby, the word line 2 is activated by the row address decoder 501. Data items of four bits of the memory cells 8 to 11 are read on the bit lines 0 to 3.

Next, when the column address "01" of a binary number is given to the column address decoder 502, the bit line 1 is activated (or selected) by the column address decoder 502. Thereby, the data item stored on the target memory cell 9 is read out through an data input/output terminal to outside.

Thus, the DRAM access operation requires the row address and the column address for the target memory cell. When a data item stored in a memory cell connected to the same word line of the memory cell that has previously been accessed, the DRAM access operation requires only a target column address, not requires the same word address. For example, when the data item stored in the memory cell 11 is read immediately following the data item stored in the memory cell 9 is read, it is possible to read the data item stored in the memory cell 11 only by giving the target column address "11" of a binary number to the column address decoder 502, because the data items stored in the memory cells 8 to 11 have been already read on the bit lines 0 to 3.

However, in order to achieve the above operation, the following functions (1) or (2) of the DRAM 103 is required:

(1) The function to keep the activation state of the word line 2 while the memory cell 9 to the memory cell 11 are accessed; or (2) The function to latch the data items of 4 bits stored in the memory cells 8 to 11 selected by a same word line that have been read simultaneously when the memory cell 9 is accessed. In this case, when the memory cell 11 is accessed, the data item in the memory cell 11 is read from a latch circuit to store the data items of 4 bits.

This access operation is called to as "a page mode". In order to perform the page mode operation, it is required to check whether a word line to be currently accessed is equal to the word line that have previously been accessed. When both the current target word line and the previous target word line are same, it is possible to perform the page mode operation (hereinafter, referred to as "a page hit"). When both word lines are different to each other, it must be required to perform a normal access operation (hereinafter, referred to as "a normal access").

Refresh control

The refresh operation for the DRAM 103 is performed according to a refresh request generated at a predetermined constant time period based on a counter data item output from an internal counter (omitted from the drawing). Furthermore, it must be required to perform tests for the function of bus controller 104 and the DRAM 103.

Hereinafter, a description will be given of the tests of the bus controller 104 and the DRAM 103.

Tests for the function of bus control

The tests for the function of the bus control for the bus group 105 formed on the semiconductor chip 101 includes the test to check whether the bus controller 104 performs correctly when a collision among a plurality of bus-access requests occurs or when a collision between the bus access request and the refresh request occurs. It is sufficient to consider only a case in which the refresh request is repeatedly generated every a predetermined time interval. However, in the test of the function of the bus, it must be required to consider cases in which a collision between the refresh request and the bus access request causes and a collision between the bus access requests while the refresh request does not occur.

When the refresh request is generated at a constant time interval and it is not generated at an optional time interval, it becomes difficult to perform a timing matching between the refresh request and the bus access request or the execution of the test operation must be waited until the refresh request is generated. It thereby causes drawbacks that the period of a program development becomes long and the time of the test operation becomes long.

Test for DRAM

FIG. 6 is a diagram showing the configuration of a part of the DRAM 103. In FIG. 6, transistors T1 to T3 are connected between the bit line B and the word lines W1 to W3, respectively. Each of the transistors T1 to T3 is connected to each of the capacitors C1 to C3, respectively. There is a test called to as "a Read Disturb test" in the tests for the DRAM 103.

Object of the Read Disturb test

When the word line W2 designated by the solid line shown in FIG. 6 is frequently accessed (or selected), noises cause on the adjacent word lines W1 and W3 that are not selected. In this situation, the transistors T1 and T3 connected to the adjacent word lines W1 and W3 enter ON even if those transistors T1 and T3 are not selected. Then, electric charges in the capacitors C1 and C3 are discharged, so that the data item stored in the capacitors C1 and C3 are changed from 1 to zero, respectively. The Read Disturb test may detect the above error state.

The operation of the Read Disturb test will be explained with reference to FIG. 7.

First, as shown in the step ST1, initial data items are written into all bits as all memory cell in the DRAM 103. Next, as shown in the step ST2, the all bits designated by the row=0 are read out during a predetermined time period. In other words, the refresh operation is performed as shown in the step ST3 after the word line designated by the row address=0 is accessed repeatedly.

Then, as shown in the step ST4, the row address is incremented by 1 in order, and then the above steps ST2 and the step ST4 are performed repeatedly for the row addresses=0 to 3. After this operation, the all bits in the DRAM 103 are read out and then compared with the initial values.

Next, as shown in the step ST6, the all bits in the DRAM 103 are inverted, and then the above steps ST2 to ST5 are repeated.

Operation to be required for Read Disturb test

The operation at the step ST2 requires to perform the activation and the non-activation of the same word line. That is, the operation at the step ST2 requires to rise and to fall the voltage potential of the same word line, repeatedly. But, in the DRAM having the function of the page mode, the access operation to access the same word line that has previously been accessed enters the page hit, so that the word line is activated or not activated continuously.

The operation in the step ST2 must perform without the execution of the refresh operation. It is therefore required to perform the refresh operation at an optional timing.

During the test operation described above, interface terminals 103a to 103c in the DRAM 103 are electrically disconnected from the bus controller 104 and connected to the external terminals 106a to 106c in order to control the operation of the DRAM 103 by an external device (not shown) such as a memory tester instead of the bus controller 104. This is called to as "a memory test mode".

On the other hand, there are a burn-in test and a final test in the tests for the semiconductor integrated circuit (hereinafter also referred to as a large Scale integration (LSI)).

The burn-in test is the test in which an LSI is performed in a higher temperature and under a higher voltage in order to increase the occurrence of the initial failure and in order to decrease the shipping of the products involving the initial failure. The final test is performed after the burn-in test.

Because the tester to be used for the burn-in test has a lower timing accuracy and the number of test patterns is small and the kinds of tests are limited, this tester to be used in the burn-in test may test a plurality of LSI devices simultaneously and the cost of the tester is cheep. Therefore the cost of the burn-in test operation is low in general.

On the other hand, because the tester to be used for the final test operation has a higher accuracy and may test many kinds of test patterns, the cost of this tester becomes high. Therefore the cost of the final test becomes high.

The read disturb test requires the maximum time to keep the data items without any refresh operation during the operation for one word line shown in the step ST2. Because this time period is longer than the access time period of the DRAM 103, the read disturb test becomes longer than other DRAM tests. This causes to increase the testing cost of the DRAM. In general, the read disturb test is performed in the final test process. If it is performed in the burn-in test process, it is possible to decrease the testing cost of the DRAM.

However, because the tester to be used for the burn-in test has a small number of test patterns, the kinds of test programs are limited in use. That is, it must be required to execute the test program under the condition that the CUP 102 executes instructions in the test program automatically without inputting any test program through external pins of a semiconductor chip after the test program has been downloaded into the semiconductor chip. Because the read disturb test requires an operation that is different from the normal operation described above, it must be required to input test patterns through the external pins of the semiconductor integrated circuit during the memory test mode. Because the read disturb test is not performed only by the execution of the CPU, the read disturb test and the burn-in test can not be performed simultaneously.

Since the conventional semiconductor integrated circuit having the DRAM and other devices mounted on the same semiconductor chip has the above configuration, it is difficult to generate and output a refresh request at optional time period and difficult to control the operation of the DRAM in the page mode. Thereby, the conventional semiconductor integrated circuit has drawbacks that the content of a test program becomes complicated and it causes to increase the testing time.

Furthermore, because test patterns are inputted through external terminals of the semiconductor integrated circuit during the memory test mode, it is difficult to perform the read disturb test during the burn-in test of a cheaper testing cost.

SUMMARY OF THE INVENTION

Accordingly, an object of the present invention is, with due consideration to the drawbacks of the conventional semiconductor integrated circuit having the DRAM and other devices mounted on the same semiconductor chip, to provide a semiconductor integrated circuit having a DRAM and other devices mounted on a same semiconductor chip whose test programs are easily made and the cost of the test therefor may be decreased.

In accordance with a preferred embodiment of the present invention, a semiconductor integrated circuit having a random access memory (DRAM), comprises a central processing unit (CPU) for controlling and performing various types of operations, a DRAM for storing and outputting data items, a bus controller comprising refresh control means, and an internal bus group for electrically connecting the CPU, the DRAM, and the bus controller to each other. The bus controller comprising refresh control means comprises forced refresh request means for setting an optional interval of a refresh time for the DRAM, and refresh request stop means for forcibly stopping to output the refresh request from the forced refresh request means, and an internal bus group for electrically connecting the CPU, the DRAM, and the bus controller to each other. In the semiconductor integrated circuit, the CPU, the DRAM, and the bus controller are mounted on the same semiconductor chip.

In the semiconductor integrated circuit having a DRAM mounted on a same semiconductor chip as another preferred embodiment, the forced refresh request means, that may be accessed by executing an instruction by the CPU, comprising a refresh counter for counting a number from a value in the refresh counter that is written by the CPU and for outputting the refresh request at a different timing from a constant time interval, and wherein the refresh request stop means comprising a first register, that may be accessed by executing an instruction by the CPU, stops to output the refresh request from the refresh control means based on a value stored in the first register.

In the semiconductor integrated circuit having a DRAM mounted on a same semiconductor chip as another preferred embodiment, the forced refresh request means comprising a second register, that may be accessed by executing an instruction by the CPU, for outputting the refresh request at a different timing that is different from a constant time interval based on the value from the second register, and wherein the refresh request stop means comprising a first register, that may be accessed by executing an instruction by the CPU, for halting to output the refresh request based on a value stored in the first register.

In the semiconductor integrated circuit having a DRAM mounted on a same semiconductor chip as another preferred embodiment, the forced refresh request means, that may be accessed by executing an instruction by the CPU, comprising a refresh counter for counting a number from a value in the refresh counter that is written by the CPU and for outputting the refresh request at a different timing from a constant time interval, and wherein the operation of the refresh request stop means may be controlled by an external device through an external terminal.

In the semiconductor integrated circuit having a DRAM mounted on a same semiconductor chip as another preferred embodiment, the forced refresh request means comprising a second register, that may be accessed by executing an instruction by the CPU, for outputting the refresh request at a different timing that is different from a constant time interval based on a value from the second register, and wherein the operation of the refresh request stop means may be controlled by an external device through an external terminal.

In accordance with another preferred embodiment of the present invention, a semiconductor integrated circuit having a random access memory (DRAM), comprises a central processing unit (CPU) for controlling and performing various types of operations, a DRAM for storing and outputting data items, a bus controller, and an internal bus group for electrically connecting the CPU, the DRAM, and the bus controller to each other. The bus controller comprises refresh control means and page mode stop means for halting to output a page mode request signal to the DRAM. The refresh control means comprises forced refresh request means for setting an optional interval of a refresh time for the DRAM, and refresh request stop means for forcibly stopping to output the refresh request from the forced refresh request means. In the semiconductor integrated circuit, the CPU, the DRAM, and the bus controller are mounted on the same semiconductor chip.

In the semiconductor integrated circuit having a DRAM mounted on a same semiconductor chip as another preferred embodiment, the page mode stop means for halting to access the page mode comprising a page mode stop register, that may be accessed by executing an instruction by the CPU, and means for controlling to access the page mode, based on a value of the page mode stop register.

In the semiconductor integrated circuit having a DRAM mounted on a same semiconductor chip as another preferred embodiment, the page mode stop means comprises means, for controlling to access the page mode, that may be accessed by an external device through an external terminal.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

Preferred embodiments of a semiconductor integrated circuit having a dynamic random access memory (DRAM), a central processing unit, a bus controller, and a read only memory (ROM), and the like mounted on a same semiconductor chip according to the present invention will now be described with reference to the drawings.

First embodiment

Figure 1:
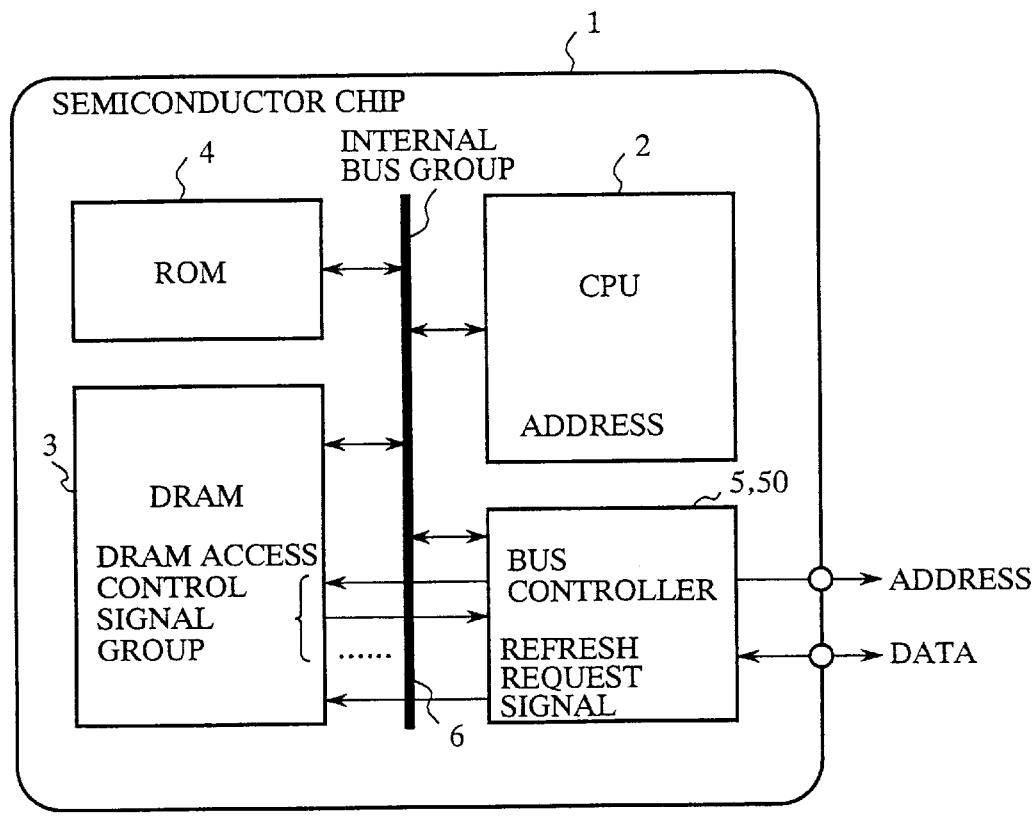
FIG. 1 is a diagram showing a configuration of a semiconductor integrated circuit having a DRAM mounted on a same semiconductor chip as a first embodiment.
Figure 6:
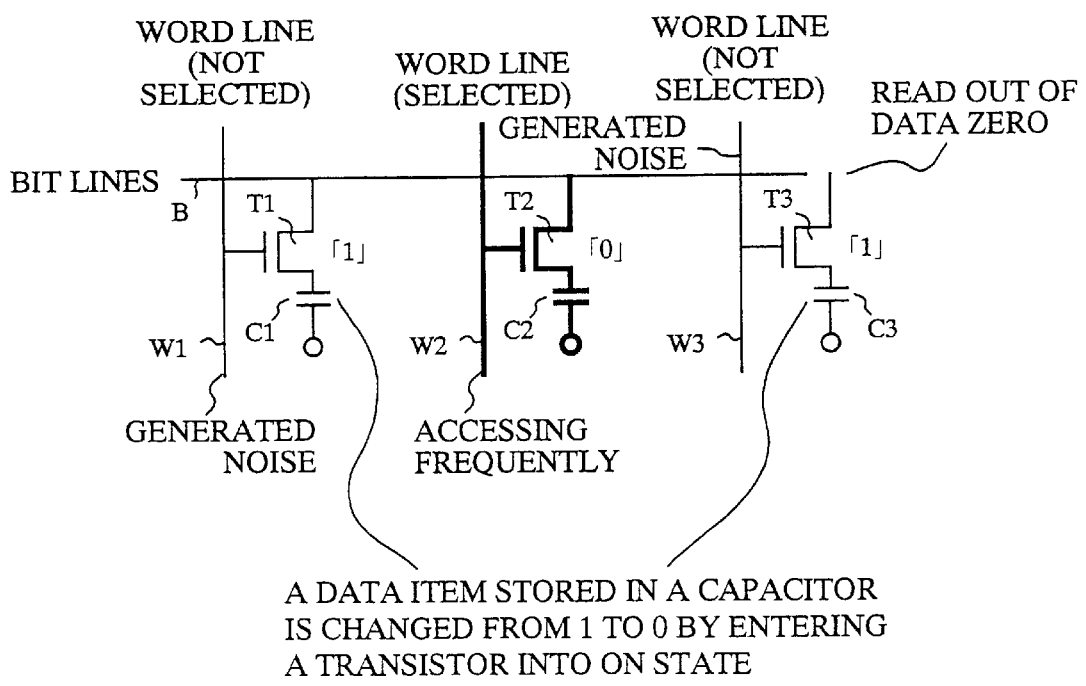
FIG. 6 is a diagram showing a configuration of a part of the DRAM.

FIG. 1 is a diagram showing a configuration of a semiconductor integrated circuit having a DRAM, a CPU, a bus controller, and the like mounted on a same semiconductor chip as a first embodiment. In FIG. 1, the reference number 1 designates a semiconductor chip. The reference number 3 indicates a DRAM, the reference 4 indicates a ROM, and 5 designates a bus controller. The reference number 2 denotes a CPU in which a plurality of registers are incorporated to execute various instructions such as a load instruction, a store instruction, an addition instruction, a branch instruction such as a non-conditional branch instruction and a conditional branch instruction, and the like. In the execution of the load instruction, a data item stored in a memory is read and then written into a register or registers. In the execution of the store instruction, a data item stored in the register is stored into the memory. In the execution of the transfer instruction, a data item is transferred between registers and an immediate value is stored in a register. In the execution of the addition instruction, data items stored in registers are added. In the execution of the branch instruction, the flow of the operation is branched.

The CPU 2 may also access the DRAM 3, the ROM 4, and control registers incorporated in the bus controller 5, and external devices (omitted from drawings) through the bus controller 5. Those component elements 2, 3, 4, and 5 in the semiconductor integrated circuit are connected through an internal bus group 6 and also mounted on the same semiconductor chip 1.

The DRAM 3 mounted on the semiconductor chip 1 supports a page mode. When a refresh request signal "1" is generated and transferred from the bus controller 5, the DRAM performs the refresh operation.

The ROM 4 is also mounted on the same semiconductor chip 1. The bus controller 5 mounted on the same semiconductor chip 1 performs all of bus access controls such as, a refresh request to the DRAM 3, an access control to the DRAM 3, and a detecting operation to detect an occurrence of a page hit operation or a page miss operation, transferred from internal devices and external devices of the semiconductor integrated circuit. The internal data bus group 6 connects the CPU 2, the DRAM 3, the ROM 4, and the bus controller 5 to each other.

Figure 2:
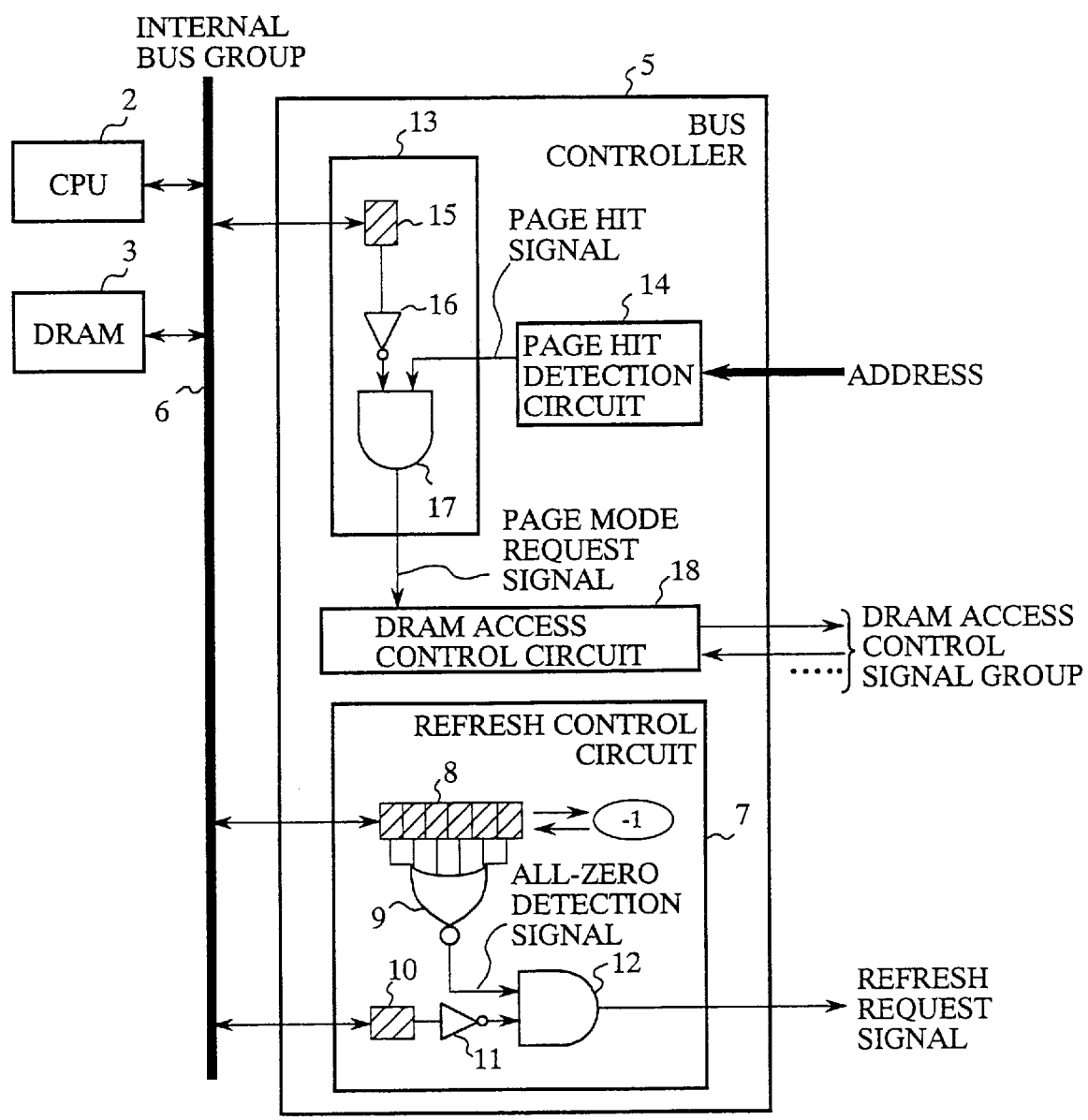
FIG. 2 is a diagram showing a detailed configuration of a bus controller in the semiconductor integrated circuit as the first embodiment.
Figure 3:
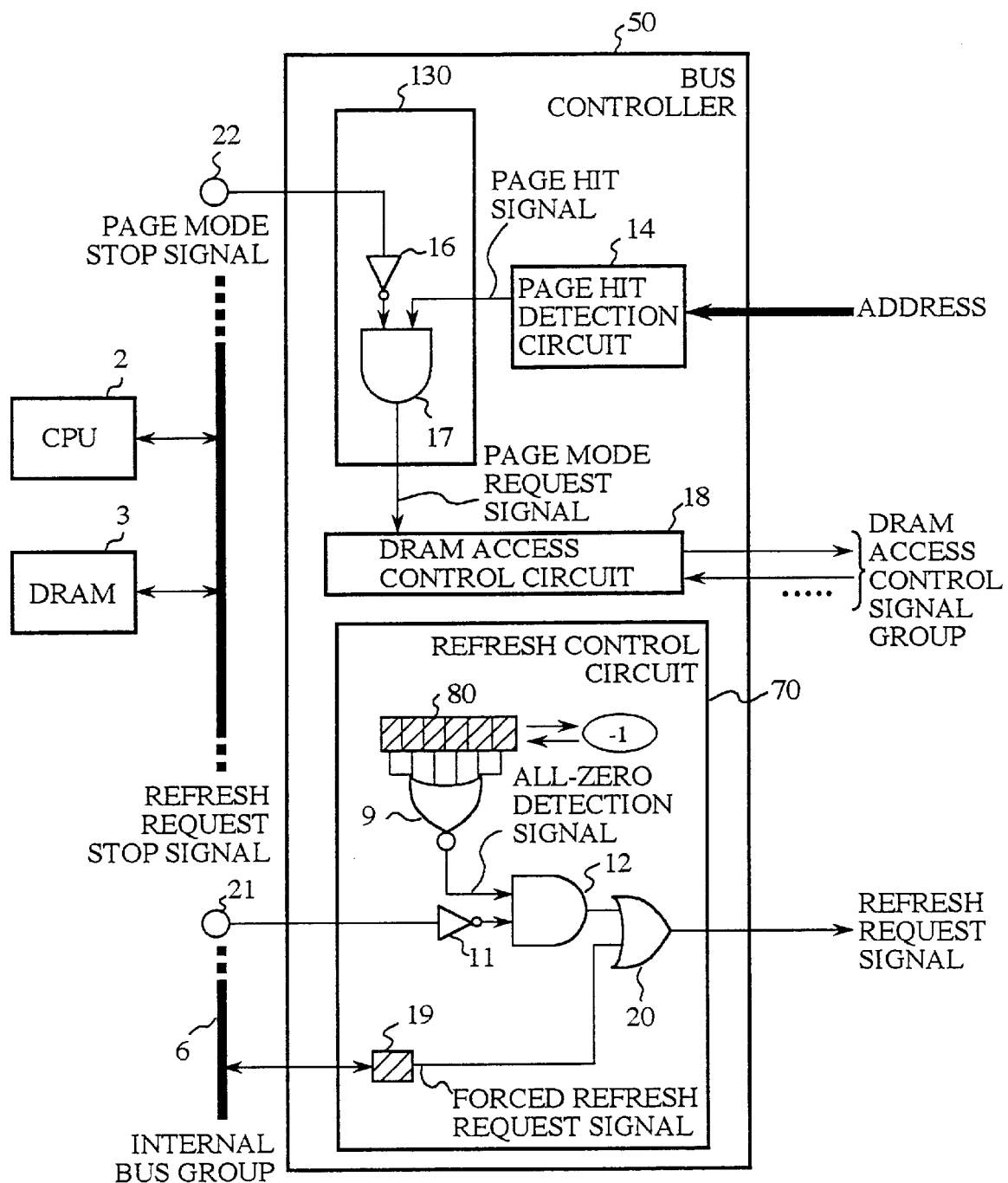
FIG. 3 is a diagram showing a detailed configuration of a bus controller in a semiconductor integrated circuit as the second embodiment.
Figure 4:
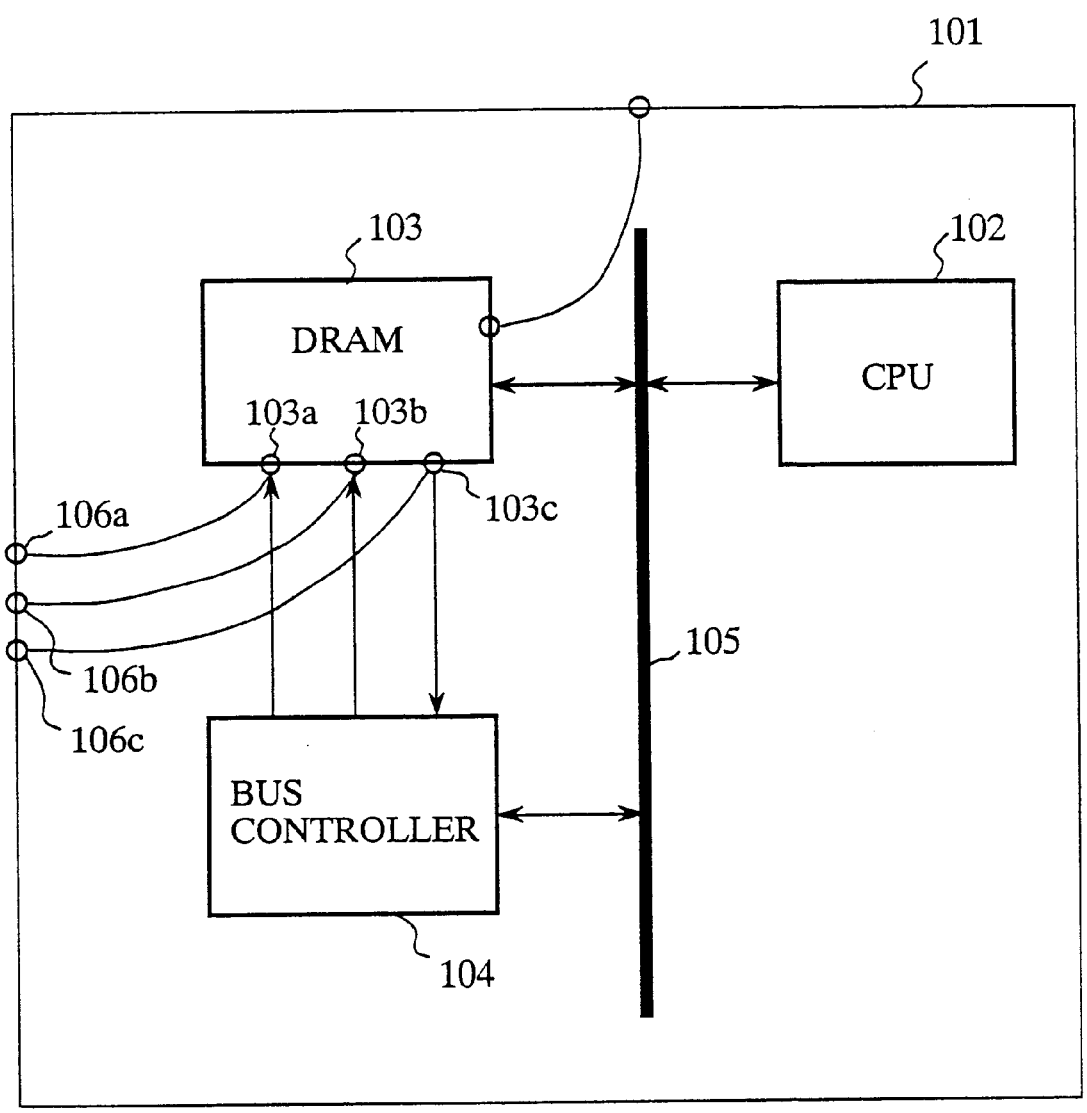
FIG. 4 is a diagram showing a configuration of a conventional semiconductor integrated circuit having a DRAM mounted on a same semiconductor chip.
Figure 5:
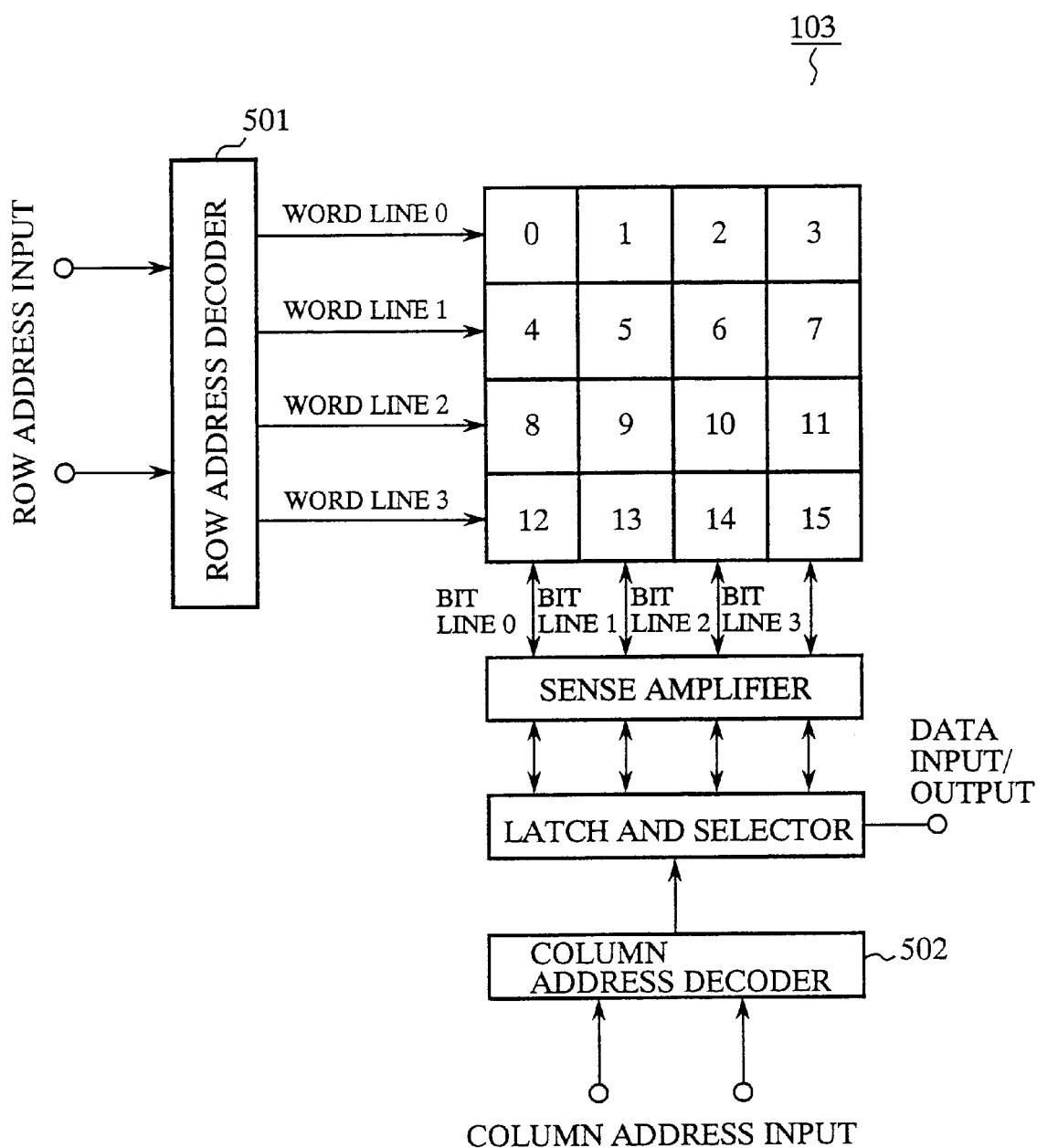
FIG. 5 is a diagram showing a simple model of the configuration of the DRAM.
Figure 7:
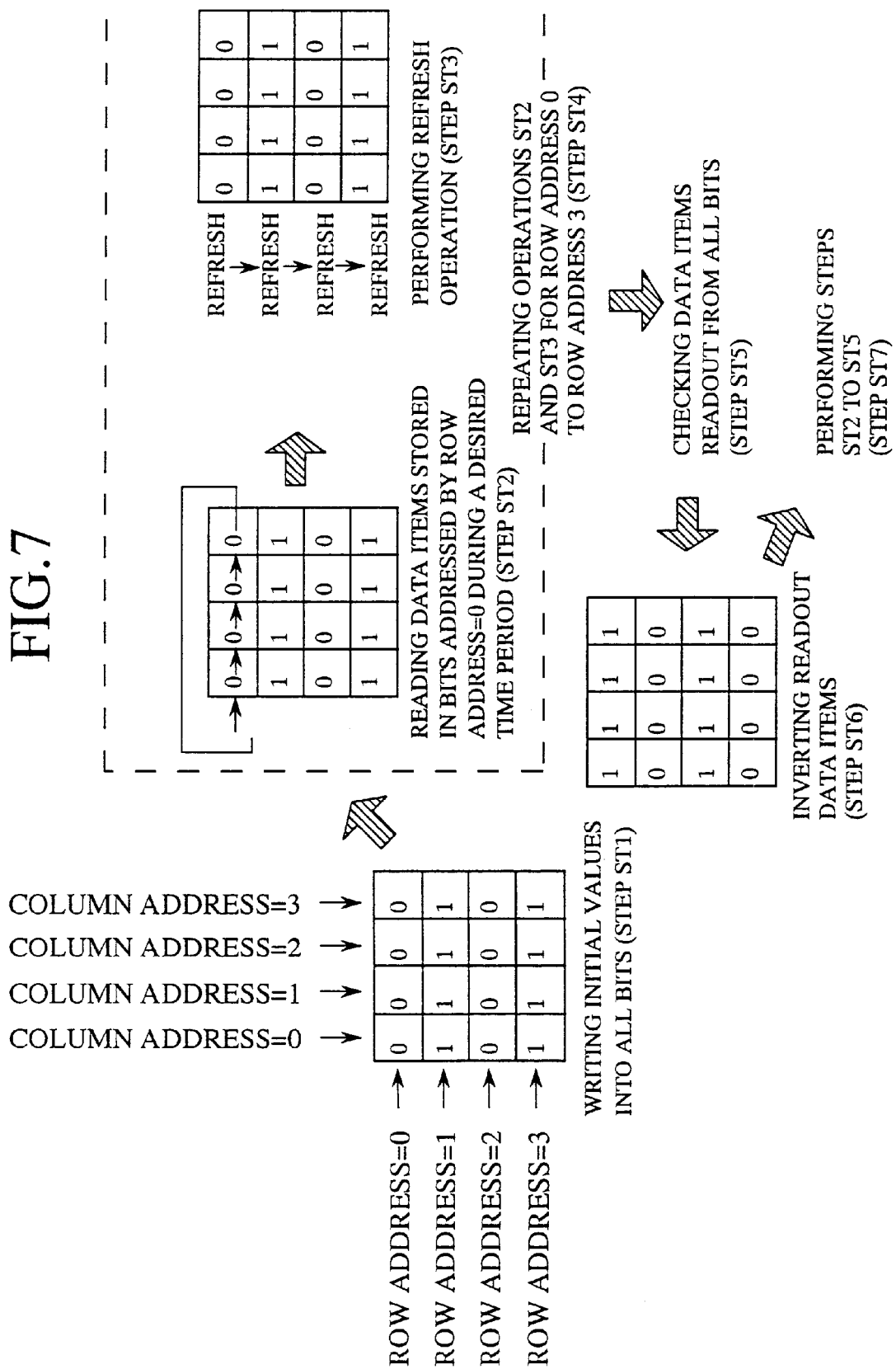
FIG. 7 is a sequence flow of a read disturb test for the DRAM.

FIG. 2 is a diagram showing a detailed configuration of the bus controller 5 incorporated in the semiconductor integrated circuit as the first embodiment. In FIG. 3, the reference number 7 designates a refresh control circuit, and 13 indicates a page mode stop circuit. The refresh control circuit 7 comprises a register acting as a refresh counter 8, a NOR gate 9, a refresh request stop register 10, an inverter 11, and an AND gate 12 for performing a logical operation of the outputs from the NOR gate 9 and the inverter 11. The CPU 2 executes an instruction to access the refresh counter 8. That is, the value of the refresh counter 8 is changed by executing the instruction by the CPU 2. The operation of the refresh request stop register 10 is also accessed by executing an instruction by the CPU 2.

The refresh counter 8 and the NOR gate 9 form a forced refresh circuit. The refresh request stop register 10 and the inverter 11 form the refresh request stop circuit.

The page mode stop circuit 13 comprises a page mode stop register 15, an inverter 16, and an AND gate 17 for performing a logical operation of the outputs from a page hit detection circuit 13 to input address signals and the inverter 16. The page mode stop register 15 is accessed by executing an instruction by the CPU 2. The inverter 16 and the AND gate 17 form the page mode stop circuit.

Next, a description will be given of the operation of the semiconductor integrated circuit having the DRAM and other devices mounted on the same semiconductor chip 1 as the first embodiment.

In order to keep data items, the DRAM 3 must perform the refresh operation within a predetermined time period.

The bus controller 5 having the counter 8 and generates and outputs a refresh request signal every a constant time period. During the normal operation, the value of the refresh counter 8 is counted down. When the value of the refresh counter 8 reaches zero, the bus controller 5 generates and outputs the refresh request signal to the DRAM 3. During the test operation mode, the CPU 2 writes the value 1 to the refresh request stop register 10 in order to halt the output of the refresh request signal. In addition, during the test operation mode, the CPU 2 write an optional value into the refresh counter 8 so that the bus controller 5 may outputs the refresh request signal at a desired optional time.

Hereinafter, a resource and operation of the refresh control will be explained.

First, the counter value of the refresh counter 8 is initialized at a reset process, so that the counter value of the refresh counter 8 becomes 1.

The counter value of the refresh counter 8 is counted down by 1 every one clock cycle. When the counter value of the refresh counter 8 becomes zero, the all-zero detection signal becomes 1. After this, at the following clock cycle, the counter value of the refresh counter 8 is also changed to all 1.

Because the CPU 2 may write an optional counter value into the refresh counter 8 by executing a store instruction, the CPU 2 executes the store instruction and writes an optional value into the refresh counter 8. The optional value written in the refresh counter 8 is counted down in a following operation.

The refresh request register 10 is initialized to zero by a reset operation. When a value that is set in the refresh request stop register 10 is zero, the all-zero detection signal is output to the DRAM 3 as a refresh request signal. When the value that is set in the refresh request stop register 10 is all 1, the bus controller 5 outputs no refresh request signal to the DRAM 3 even if the NOR gate 9 outputs the all-zero detection signal.

DRAM access control

When receiving the DRAM access request signal and an address transferred from the CPU 2, the bus controller 5 accesses the DRAM 3. First, the bus controller 5 checks whether or not the accessing of the page mode may be performed based on the detection result of the page hit detection circuit 14. Then, the bus controller 5 generates a DRAM access control signal according to the detection result of the page hit detection circuit 14.

During the test operation mode, the bus controller 5 sets the value of the page mode stop register 15 to 1 so that the DRAM 3 may be always accessed under the condition of a page-miss state.

Next, a description will be given of the resource and its operation relating the DRAM access control.

The page hit detection circuit 14 stores an ROW address that has been used in a previous accessing and compares a current row address with the stored previous row address. When both are equal, the page hit detection circuit 14 generates and outputs the page hit signal of 1. When both addresses are not equal, the page hit detection circuit 14 generates and outputs a page hit signal of zero.

The DRAM access control circuit 18 generates an access control signal to the DRAM 3 according to the DRAM access request transferred from the CPU 2. During the access request, when the page mode request signal is 1, the DRAM access control circuit 18 accesses the DRAM 3 in the page mode accessing, and when zero, the DRAM access control circuit 18 accesses the DRAM 3 in the normal accessing.

The CPU 2 writes a desired value into the page mode stop register 15 by executing a store instruction. When a reset operation is performed, the page mode stop register 15 is initialized to zero. When the value of the page mode stop register 15 is zero, the page hit signal is inputted to the DRAM access control circuit 18 as the page mode signal without any changing. When the value of the page mode stop register 15 is 1, the page mode request signal becomes zero regardless of the value of the page hit signal transferred from the page hit detection circuit 14.

As described above, according to the semiconductor integrated circuit having the DRAM and other devices mounted on the same semiconductor chip as the first embodiment, it is possible to change to output the refresh request at a desired time interval optionally, and to stop to output the refresh request signal. It is thereby possible to easily make a collision condition between a bus access request and a refresh request. Accordingly, it is possible to develop test programs for the bus control operation and to reduce the testing time period as short as possible. In addition, because the accessing in the page modes is stopped optionally, the read disturb test may be performed during the burn-in test process of a cheaper testing cost, so that the cost of the total test for the semiconductor chip can be reduced.

Second embodiment

FIG. 3 is a diagram showing a detailed configuration of a bus controller 50 in the semiconductor integrated circuit as the second embodiment. In FIG. 3, the reference number 19 designates a forced refresh request register that may be accessed based on the executing of an instruction by the CPU 2. The reference number 20 designates an OR gate for inputting the outputs from the AND gate 12 and the forced refresh register 19. The reference numbers 21 and 22 denote external terminals through which both the invertors 11 and 16 are controlled by external devices (omitted from drawings). The reference number 50 denotes a bus controller, and 80 indicates a refresh counter. In the second embodiment, the CPU 2 can not directly access this refresh counter 80. This refresh counter 80 is different in configuration and operation from the refresh counter 8 in the bus controller 5 in the semiconductor integrated circuit as the first embodiment shown in FIG. 2. The reference number 70 designates a refresh control circuit comprising the NOR gate 9, the inverter 11, the AND gate 12, the forced refresh request register 19, the OR gate 20, and the refresh counter 80. The inverter 11 forms the refresh request stop circuit. The reference number 130 indicates a page mode stop circuit comprising the inverter 16 and the AND gate 17. Although the page mode stop circuit 13 in the bus controller 5 of the first embodiment includes the register 15 that is accessed directly by the CPU 2, the page mode stop circuit 130 in the bus controller 50 of the second embodiment includes no register. External devices (not shown) may transfer a control signal relating the generation of the page mode request signal to the page mode stop circuit 130 through an external terminal 22. Other components in the bus controller 50 are the same as those of the bust controller 5 of the first embodiment, and the same reference numbers are used for the same components, therefore, the explanation of them is omitted here for brevity.

Next, a description will be given of the operation of the semiconductor integrated circuit having the DRAM and other devices mounted on the same semiconductor chip of the second embodiment.

An external device (not shown) transfers a refresh request stop signal to the inverter 11 forming the refresh request stop circuit through the external terminal 21 in order to halt the output of the refresh request signal by the refresh control circuit 70. In addition, an external device transfers a page mode stop signal to the inverter 16 forming the page mode stop circuit through the external terminal 22 in order to halt the execution of the page mode. In the configuration shown in FIG. 3, the refresh counter 80 is not connected to the internal bus group 6 (that is, the CPU 2 can not access the refresh counter 80 by executing a store instruction).

On the other hand, the forced refresh request register (1 bit) 19 is initialized to zero at a reset operation. When the value of the forced refresh request register 19 is zero, the all-zero detection signal is output as the refresh request signal without any changing. When the value of the forced refresh register 19 is 1, the refresh request signal is set to 1 regardless of the value of the all-zero detection signal provided from the NOR gate 9. That is, the bus controller 50 may generate the refresh request signal at an optional timing.

As described above, according to the semiconductor integrated circuit having the DRAM and other devices mounted on the same semiconductor chip, because the external device (not shown) connected to the external terminal 21 of the bus controller 50 may set the generation of the refresh request at an optional timing. In addition to this function, the bus controller 50 in the semiconductor integrated circuit of the second embodiment may halt the output of the refresh request in order to suppress the execution of the page mode operation for the DRAM 2.

Third embodiment

It is acceptable to have another configuration of the semiconductor integrated circuit having the DRAM and other devices mounted on the same semiconductor chip. In this configuration, the inverter 11 forming the refresh request stop circuit in the bus controller 50 in the semiconductor integrated circuit as the second embodiment is incorporated (to which the refresh request stop signal is provided through the external terminal 21) instead of the refresh request stop register 10 in the bus controller 5 in the semiconductor integrated circuit as the first embodiment. The semiconductor integrated circuit having the above configuration may obtain the same effect of the first and second embodiments.

Furthermore, it is also acceptable to have another configuration of the semiconductor integrated circuit having the DRAM and other devices mounted on the same semiconductor chip. In this configuration, the refresh request stop register 10 forming the refresh request stop circuit in the bus controller 5 as the first embodiment shown in FIG. 2 (whose value may be written by the execution of the instruction by the CPU 2) is used instead of the external terminal 21 in the bus controller 50 as the second embodiment shown in FIG. 3 (In the second embodiment, the refresh request stop signal is provided from the external device (omitted from drawings) through the external terminal 21).

The semiconductor integrated circuit having the above configuration may also obtain the same effect of the semiconductor integrated circuit having the DRAM and other devices mounted on the same semiconductor chip as the first and second embodiments.

As set forth above, according to the present invention, because the refresh control circuit has the refresh request stop circuit and the forced refresh request circuit capable of generating the refresh request signal at a desired optional timing, it is possible to prevent the output of undesired refresh request signals and to easily make a collision condition of the bus access request and the refresh request, so that the test program to be used for the bus control operation may be easily developed and it is possible to reduce the time period required for the test.

In addition, according to the present invention, because the refresh control circuit and the page mode stop circuit are incorporated in the bus controller, the DRAM 3 may be tested by using the CPU 2. As a result, it is possible to perform the read disturb test during the burn-in test whose cost is cheep, so that it is possible to reduce the cost required for the test of the semiconductor chip.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A semiconductor integrated circuit having a random ccess memory (DRAM), comprising:
   a central processing unit (CPU) for controlling and performing various types of operations;

a DRAM for storing and outputting data items;

a bus controller comprising refresh control means comprising:

forced refresh request means for setting an optional interval of a refresh time for the DRAM; and refresh request stop means for forcibly stopping output of a refresh request from the forced refresh request means, and an internal bus group for electrically connecting the CPU, the DRAM, and the bus controller to each other, wherein the CPU, the DRAM, and the bus controller are on a single semiconductor chip.

2. A semiconductor integrated circuit having a DRAM on a single semiconductor chip as claimed in claim 1, wherein the forced refresh request means, that may be accessed by executing an instruction by the CPU, comprising a refresh counter for counting a number from a value in the refresh counter that is written by the CPU and for outputting the refresh request at a different timing from a constant time interval, and wherein the refresh request stop means comprising a first register, that may be accessed by executing an instruction by the CPU, stops to output the refresh request from the refresh control means based on a value stored in the first register.

3. A semiconductor integrated circuit having a DRAM on a single semiconductor chip as claimed in claim 1, wherein the forced refresh request means comprising a second register, that may be accessed by executing an instruction by the CPU, for outputting the refresh request at a different timing that is different from a constant time interval based on the value from the second register, and wherein the refresh request stop means comprising a first register, that may be accessed by executing an instruction by the CPU, for halting to output the refresh request based on a value stored in the first register.

4. A semiconductor integrated circuit having a DRAM on a single semiconductor chip as claimed in claim 1, wherein the forced refresh request means, that may be accessed by executing an instruction by the CPU, comprising a refresh counter for counting a number from a value in the refresh counter that is written by the CPU and for outputting the refresh request at a different timing from a constant time interval, and wherein the operation of the refresh request stop means may be controlled by an external device through an external terminal.

5. A semiconductor integrated circuit having a DRAM on a single semiconductor chip as claimed in claim 1, wherein the forced refresh request means comprising a register, that may be accessed by executing an instruction by the CPU, for outputting the refresh request at a different timing that is different from a constant time interval based on a value from the second register, and wherein the operation of the refresh request stop means may be controlled by an external device through an external terminal.

6. A semiconductor integrated circuit having a random access memory (DRAM), comprising:

a central processing unit (CPU) for controlling and performing various types of operations;

a DRAM for storing and outputting data items;

a bus controller comprising:

refresh control means comprising:

forced refresh request means for setting an optional interval of a refresh time for the DRAM; and refresh request stop means for forcibly stopping output of a refresh request from the forced refresh request means, and page mode stop means for halting to output a page mode request signal to the DRAM, and an internal bus group for electrically connecting the CPU, the DRAM, and the bus controller to each other, wherein the CPU, the DRAM, and the bus controller are on a single semiconductor chip.

7. A semiconductor integrated circuit having a DRAM on a single semiconductor chip as claimed in claim 6, wherein the page mode stop means for halting to access the page mode comprising a page mode stop register, that may be accessed by executing an instruction by the CPU, and means for controlling to access the page mode, based on a value of the page mode stop register.

8. A semiconductor integrated circuit having a DRAM on a single semiconductor chip as claimed in claim 6, wherein the page mode stop means comprises means, for controlling to access the page mode, that may be accessed by an external device through an external terminal.

* * * * *